United States Patent
Cheng et al.

(10) Patent No.: US 9,515,435 B2
(45) Date of Patent: Dec. 6, 2016

(54) RETRACTABLE USB CONNECTOR WITH A SWINGING MEMBER PIVOTALLY DISPOSED ON AN INNER HOUSING

(71) Applicant: ADATA TECHNOLOGY CO., LTD., New Taipei (TW)

(72) Inventors: Chien-Lin Cheng, Taipei (TW); Chia-Hsiang Hsiao, New Taipei (TW)

(73) Assignee: ADATA TECHNOLOGY CO., LTD., New Taipei (TW)

( * ) Notice: Subject to any disclaimer, the term of this patent is extended or adjusted under 35 U.S.C. 154(b) by 0 days.

(21) Appl. No.: 14/810,539

(22) Filed: Jul. 28, 2015

(65) Prior Publication Data

US 2016/0285213 A1    Sep. 29, 2016

(30) Foreign Application Priority Data

Mar. 25, 2015  (TW) .............................. 104109522 A

(51) Int. Cl.
*H01R 13/44*    (2006.01)
*H01R 24/60*    (2011.01)
*H01R 13/629*   (2006.01)
*H01R 107/00*   (2006.01)

(52) U.S. Cl.
CPC ........ *H01R 24/60* (2013.01); *H01R 13/62905* (2013.01); *H01R 2107/00* (2013.01)

(58) Field of Classification Search
CPC .... H01R 13/44; H01R 13/447; H01R 13/60; H01R 13/62; H01R 13/66; H01R 13/629; H01R 13/62905; H01R 13/6335; H01R 13/635
USPC .......................... 139/157, 159, 160, 131, 135
See application file for complete search history.

(56) References Cited

U.S. PATENT DOCUMENTS

| | | | |
|---|---|---|---|
| 6,695,637 B1 * | 2/2004 | Liu ........................ | H01R 31/06 439/135 |
| 7,491,074 B1 * | 2/2009 | Lai ........................ | G06K 7/0021 439/159 |
| 8,419,454 B1 * | 4/2013 | Ji ........................... | G06K 7/0021 439/159 |
| 8,814,582 B2 * | 8/2014 | Lee ..................... | G06K 13/0812 439/159 |
| 2001/0031571 A1 * | 10/2001 | Ito ........................ | G06K 7/0047 439/159 |
| 2006/0166533 A1 * | 7/2006 | Muramatsu .......... | H01R 13/629 439/160 |
| 2011/0147036 A1 * | 6/2011 | Cheng .................. | G06F 1/1656 174/59 |

* cited by examiner

*Primary Examiner* — Chandrika Prasad
(74) *Attorney, Agent, or Firm* — Li & Cai Intellectual Property (USA) Office

(57) ABSTRACT

A retractable USB connector includes an outer housing case, an inner housing case, and a positioning assembly. The outer housing case has an opening. The inner housing case includes a USB connector disposed at a first end of the inner housing case, a press portion disposed at a second end of the inner housing case, and the inner housing case disposed in the outer housing case. The positioning assembly is disposed between the outer housing case and the inner housing case. The positioning assembly includes a swinging member defining a positioning sliding-track and a guiding column, disposed in the positioning sliding-track. When the guiding column is located at a positioning area of the positioning sliding-track, the positioning assembly fixes the relative position of the outer housing case with respect to the inner housing case, and the USB connector is protruded from the opening of the outer housing case.

18 Claims, 9 Drawing Sheets

RETRACTABLE USB CONNECTOR WITH A SWINGING MEMBER PIVOTALLY DISPOSED ON AN INNER HOUSING

BACKGROUND OF THE INVENTION

1. Field of the Invention

The present invention relates to a portable storage device; in particular, to a retractable USB (Universal Serial Bus) connector.

2. Description of Related Art

Portable storage devices have been widely used in the electronics field for consumer electronic devices such as mobile phones, tablet PCs, the mouse, and keyboards to store and transmit data among a variety of consumer electronic devices.

As shown in FIG. 4, a retractable USB connector 1' in the market usually includes an outer housing case 11', an inner housing case 12' disposed in and moved relatively to the outer housing case 11', a spring 13' and a swinging spring 14' both disposed between the outer housing 11' case and the inner housing case 12', wherein, a sliding-track 15' is disposed on an inner surface of the outer housing case 11', one end of the swinging spring 14' is fixed at an outer surface of the inner housing case 12', and a folding arm 15' is disposed at the other end of the swinging spring 14' and is located in the sliding-track 15' of the outer housing case 11'. A USB (Universal Serial Bus) connector 121' of the inner housing case 12' can be protruded from or retracted in the outer housing case 11' via the spring 13' cooperatively working with the swinging spring 14'.

However, a size of each component of this kind of retractable USB connector 1' has to be correspondingly designed to the size of the outer housing case 11' and/or the inner housing case 12'. For example, depending on products having different sizes and shapes, during the process of mass production of the retractable USB connector 1', the swinging spring 14' and outer housing case 11' will be remanufactured, redesigned, and remolded based on relative distances among each of the components, such that the swinging spring 14' and the sliding-track 15' of the outer housing case 11' are cooperated with each other to generate sufficient power for positioning the inner housing case 12' by deformation of the swinging spring 14'.

To overcome the abovementioned drawbacks, it is necessary to provide a retractable USB connector having standardized components that may be commonly used for simplifying the manufacturing procedure, is more suitable for mass production, and reduces the manufacturing cost.

SUMMARY OF THE INVENTION

The present invention provides a retractable USB connector which includes an outer housing case, an inner housing case, a first elastic member, a swinging member, and a second elastic member. The outer housing case has an inner surface, and a guiding column is protrudingly disposed on the inner surface. The inner housing case is disposed in the outer housing case, the inner housing case is slidable along a first direction. A USB connector is disposed in the inner housing case, and the outer housing case has an opening corresponded to the USB connector. The swinging member is disposed on the inner housing case, a positioning sliding-track is disposed on the swinging member, the guiding column is located in the positioning sliding-track, and the positioning sliding-track has a curved positioning track. The first elastic member extends along the first direction, and the second elastic member is disposed on the inner housing case and connected to the swinging member.

When the inner housing case is slidden along the first direction and the USB connector is protruded from the opening of the outer housing case, the first elastic member is deformed to provide a first elastic force to the inner housing case, an inner margin of the positioning sliding-track abuts against the guiding column to push the swinging member swaying from an initial state and along a second direction, and the second elastic member is deformed to provide a second elastic force to the swinging member, wherein the first elastic force is used for returning the inner housing case back into the outer housing case, the second elastic force is used for returning the swinging member back to the initial state.

In summary, the retractable USB connector of the embodiment of the present invention may use the swinging member to cooperatively work with the first and second elastic members, such that the USB connector of the inner housing case may be cyclically changed between hidden and protruded states. Furthermore, the swinging member and/or the second elastic member may be one of the standardized components of the retractable USB connector and be unifiedly manufactured so as to decrease the manufacturing cost.

In another embodiment of the present invention, the retractable USB connector includes an outer housing case, an inner housing case, and a positioning assembly. The outer housing case has an opening. The inner housing case includes a USB connector disposed at a first end of the inner housing case, a press portion disposed at a second end of the inner housing case, and the inner housing case is disposed in the outer housing case and is configured to move relative to the outer housing case. The positioning assembly is disposed between the outer housing case and the inner housing case, wherein the positioning assembly includes a swinging member and a guiding column. The swinging member has a positioning sliding-track, and one end of the guiding column is disposed in the positioning sliding-track. The swinging member is swayed via a movement of the guiding column in the positioning sliding-track so as to change the swinging member's position. When the guiding column is located at a positioning area of the positioning sliding-track, the positioning assembly fixes the relative position of the outer housing case with respect to the inner housing case, and the USB connector is protruded from the opening of the outer housing case.

In order to further appreciate the characteristics and technical contents of the present invention, references are hereunder made to the detailed descriptions and appended drawings in connection with the present invention. However, the appended drawings are merely shown for exemplary purposes, rather than being used to restrict the scope of the present invention.

DETAILED DESCRIPTION OF THE PREFERRED EMBODIMENTS

Figure 1A:
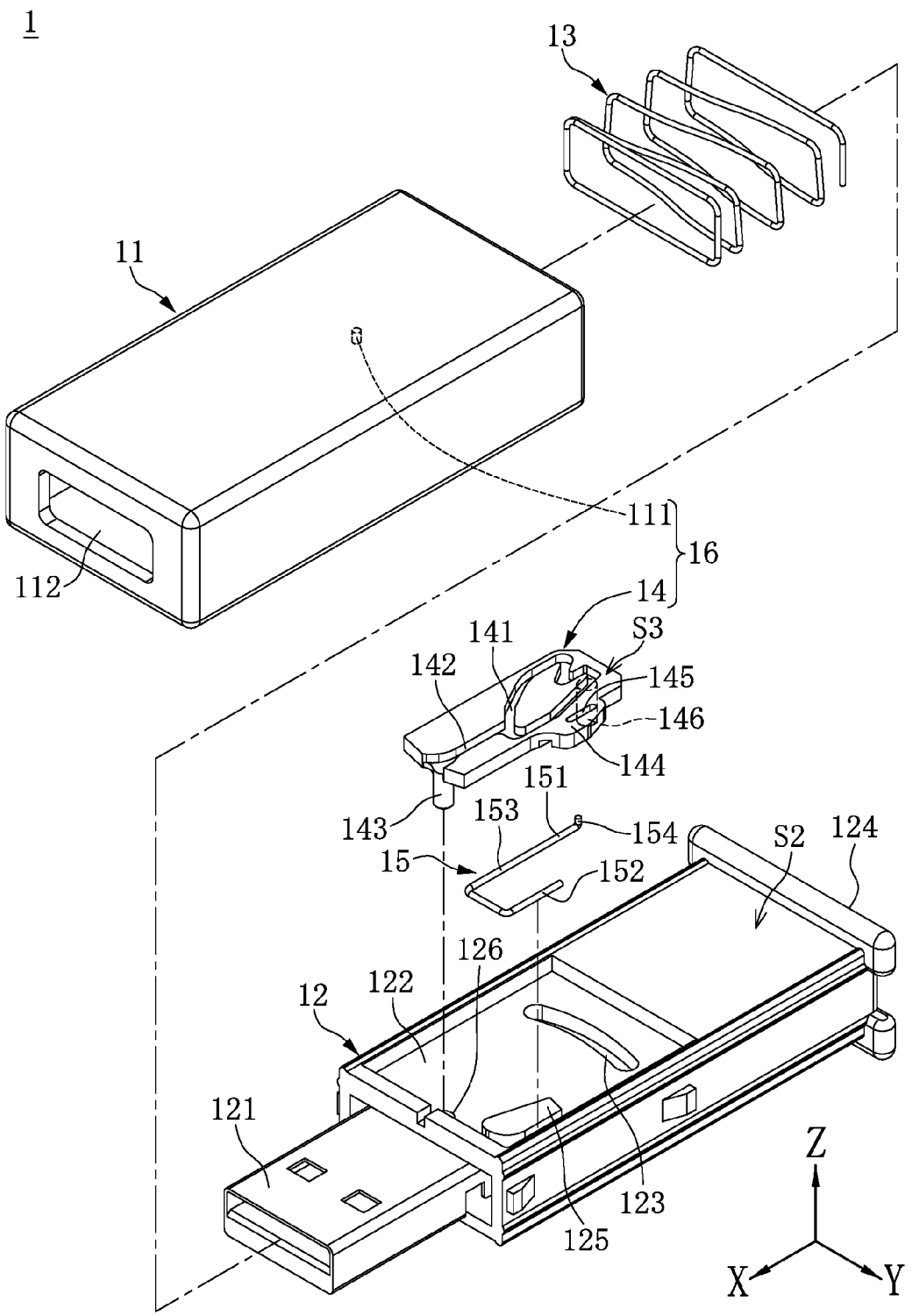
FIGS. 1A and 1B show an explosion view of a retractable USB connector of an embodiment of the present invention.
Figure 1B:
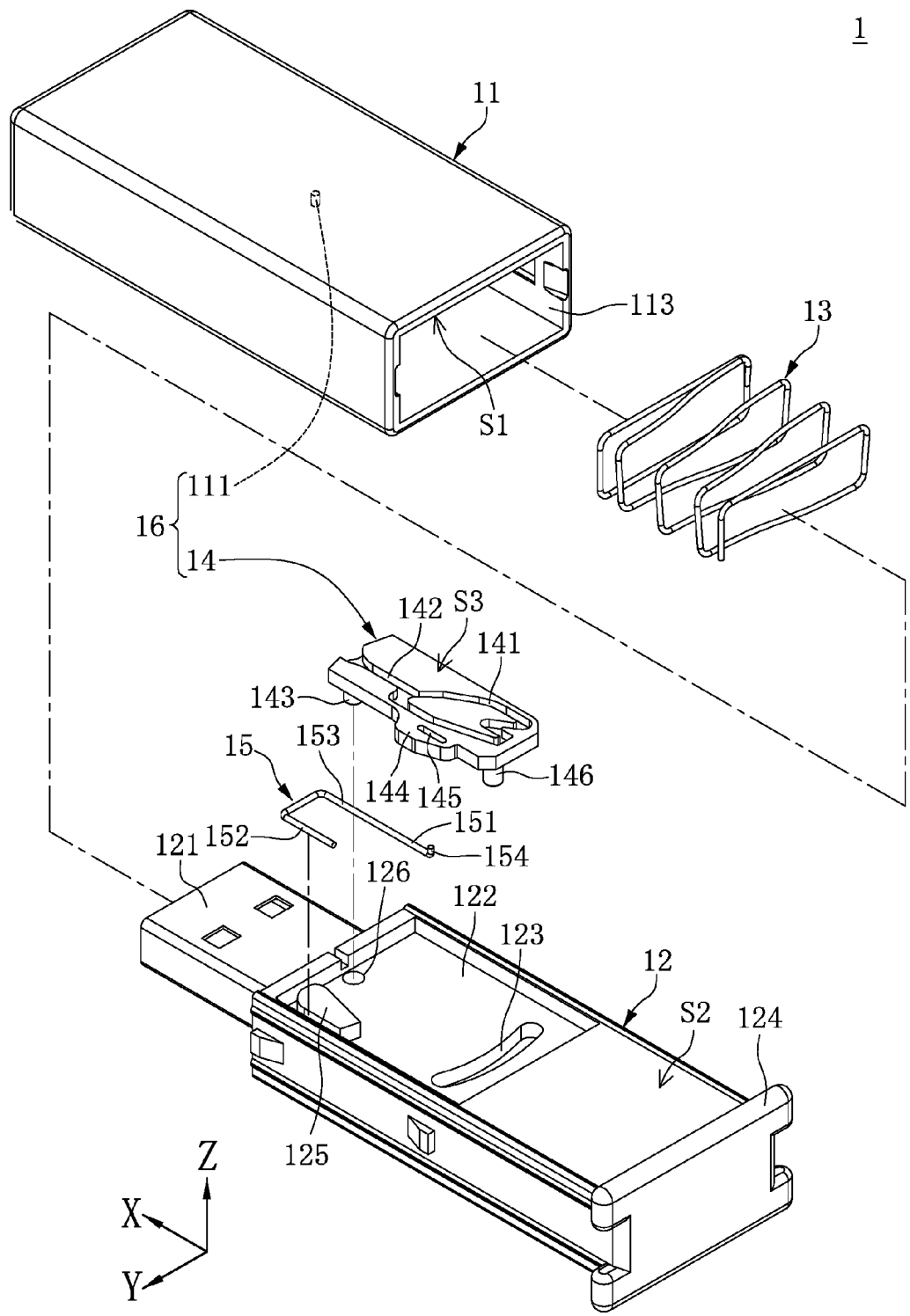

Please refer to FIGS. 1A and 1B that show an explosion view of a retractable USB connector of an embodiment of the present invention.

The present invention provides a retractable USB connector 1 which includes an outer housing case 11, an inner housing case 12 disposed in the outer housing case 11 and movable relative to the outer housing case 11, a first elastic member 13 located between the outer housing case 11 and the inner housing case 12, a swinging member 14 disposed on an outer surface S2 of the inner housing case 12, and a second elastic member 15 disposed on an outer surface S2 of the inner housing case 12 and connected to the swinging member 14. In an embodiment, the retractable USB connector 1 includes an outer housing case 11, an inner housing case 12, and a positioning assembly 16 disposed between the outer housing case 11 and the inner housing case 12, the positioning assembly 16 includes the swinging member 14 and a positioning column 111.

As mentioned above, the inner housing case 12 includes a USB (Universal Serial Bus) connector 121, and the outer housing case 11 has an opening 112 corresponding to the USB connector 121. In the preferred embodiment, the USB connector 121 may further electrically connect to an electric circuit received in the inner housing case 12, and the electric circuit includes electric components such as chips so as to achieve an electric function of the retractable USB connector 1. Via the USB connector 121, the retractable USB connector 1 may transmit electrical signals between electric equipment such e.g., computer to store electronic data.

Figure 2A:
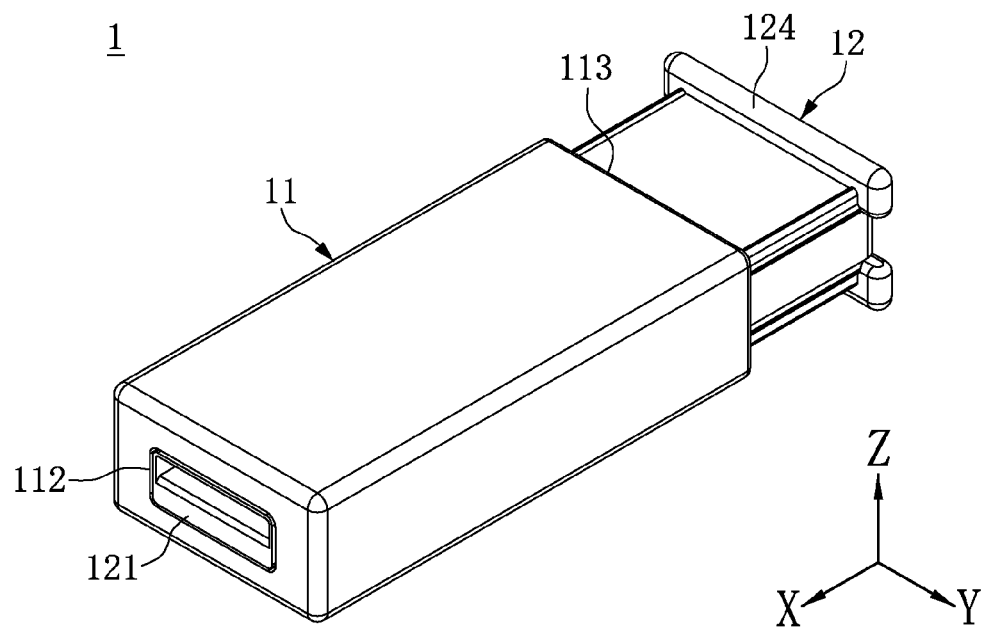
FIG. 2A shows a perspective view of FIG. 1A which is in an initial state.
Figure 2B:
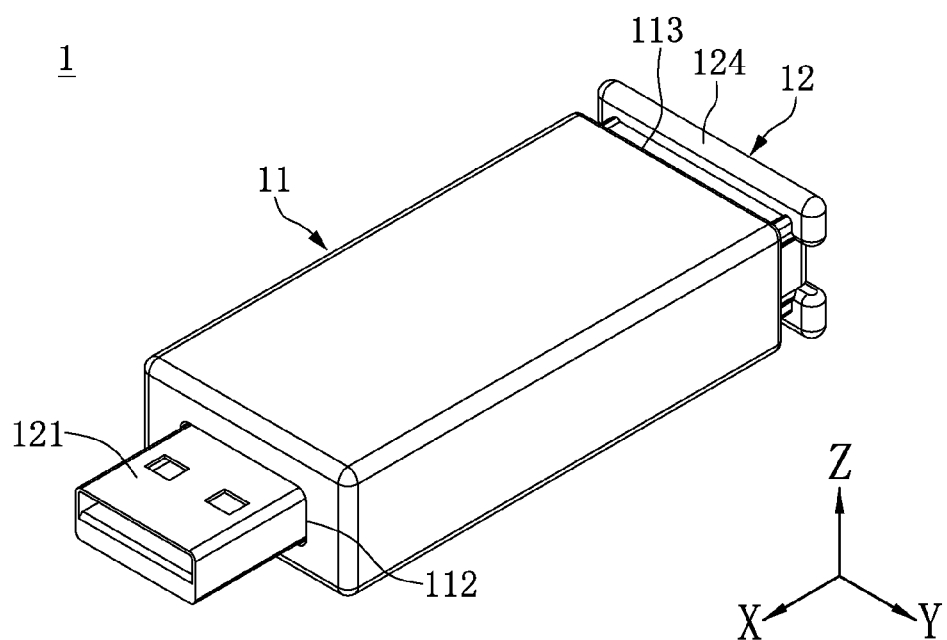
FIG. 2B shows a perspective view of FIG. 1A which is in a working state.

As shown in FIGS. 2A and 2B, FIG. 2A shows a perspective view of FIG. 1A which is in an initial state, and FIG. 2B shows a perspective view of FIG. 1A which is in a working state. At first, when the inner housing case 12 of the retractable USB connector 1 is located at a first position, the USB connector 121 is hidden in the outer housing case 11. When the inner housing case 12 is located at the first position, the swinging member 14 is in an initial state. When the retractable USB connector 1 is used, the inner housing case 12 is slidden to a second position, and the USB connector 121 is protruded from the opening 112 of the outer housing case 11. Moreover, while the first elastic member 13, the second elastic member 15, and the swinging member 14 are cooperatively worked, the USB connector 121 of the inner housing case 12 may be cyclically changed between hidden and protruded states.

Each component of the retractable USB connector 1 is described in detail as follows.

Referring to FIGS. 1A and 1B, the outer housing case 11 with tubular shape may enclosedly encompass to form a cavity with a substantial rectangle, so that the inner housing case 12, the first elastic member 13, the second elastic member 15, and the swinging member 14 may be received therein. The cavity provides a movement space that the inner housing case 12 is slidden reciprocatedly along a first direction (X-axis direction) in the movement space with respect to the outer housing case 11. The outer housing case 11 has an inner surface S1, the inner housing case 12 has an outer surface S2 facing the inner surface S1, and a guiding column 111 is protrudingly disposed on the inner surface S1. In the preferred embodiment, the outer housing case 11 may be assembled from an upper case member and a lower case member, and the substantial tubular outer housing case 11 defines two openings 112 and 113 at two ends thereof, respectively.

As shown in FIGS. 1A and 1B, the inner housing case 12 enclosedly encompasses to form a cavity with a substantial rectangle to receive a circuit (not shown). The outer surface S2 of the inner housing case 12 further defines an accommodating space 122, and the swinging member 14 and the second elastic member 15 are both received in the accommodating space 122. Hence, the swinging member 14 and the second elastic member 15 do not occupy extra space. The inner housing case 12 further includes a press portion 124 outwardly protruded from the outer housing case 11. Specifically, the press portion 124 and the USB connector 121 are respectively located at two ends of the inner housing case 12. The USB connector 121 is disposed at a first end of the inner housing case 12, and the press portion 124 is disposed at a second end of the inner housing case 12. The press portion 124 is outwardly protruded from the opening 113 of the outer housing case 11. A user may hold the outer housing case 11 using a hand and press the press portion 124 of the inner housing case 12 using a thumb to push the inner housing case 12, so that the inner housing case 12 is slidden toward the opening 112 with respect to the outer housing case 11. As mentioned earlier, when the inner housing case 12 is located at the first position, the USB connector 121 is hidden in the outer housing case 11; when the inner housing case 12 is slidden to the second position, the USB connector 121 is protruded from the opening 112 of the outer housing case 11.

Referring to FIGS. 1A and 1B, a first elastic member 13 extends along the first direction (X-axis direction), the first elastic member 13 provides a first elastic force to the inner housing case 12 which would be slidden from the second position to the first position. That is, when the inner housing case 12 is pushed and slidden from the first position to the second position, the first elastic member 13 is deformed to provide the first elastic force to let the inner housing case 12 return to the first position. In the preferred embodiment, an example of the first elastic member 13 is a spring. The first elastic member 13 may be located in the outer housing case 11 and surround the USB connector 121. As shown in the figures, the outer housing case 11 and the inner housing case 12 are directly used as supports for two ends of the first elastic member 13, and the first elastic member 13 is located at a peripheral free space of the USB connector 121. Therefore, it does not occupy extra space.

Please refer to FIGS. 1A and 1B. The swinging member 14 has a pivot portion 143, and the outer surface S2 of the inner housing case 12 has a fixing hole 126. The swinging member 14 is pivoted on the fixing hole 126 of the outer surface S2 of the inner housing case 12 through the pivot portion 143 such that the swinging member 14 is adapted for swaying along a second direction (Y-axis direction). The swinging member 14 has a surface S3, wherein the surface S3 faces the inner surface S1 of the outer housing case 11. The surface S3 of the swinging member 14 defines a positioning sliding-track 141, and the guiding column 111 of the outer housing case 11 is located in the positioning sliding-track 141. When the swinging member 14 is slidden along with the inner housing case 12 along the first direction (X-axis direction), the positioning sliding-track 141 having an inner margin abuts against the guiding column 111 to push the swinging member 14 swaying along the second direction (Y-axis direction).

As described above, specifically, the positioning sliding-track 141 includes a first slope 1411, a second slope 1412, and a curved positioning sliding-track 1413. The first slope 1411 faces the USB connector 121, the second slope 1412 facing away from the USB connector 121, and the curved positioning sliding-track 1413 is connected between the first and second slopes 1411, 1412. In the preferred embodiment, the swinging member 14 includes a head end and a tail end opposite to the head end, wherein the tail end of the positioning sliding-track 141 is more close to the USB connector 121 compared to the head end. An example of the positioning sliding-track 141 is a heart shape, one side of the positioning sliding-track 141 is the first slope 1411, the other side of the positioning sliding-track 141 is the second slope 1412, and the curved positioning sliding-track 1413 is located at the head end of the positioning sliding-track 141.

As mentioned above, the surface S3 of the swinging member 14 further includes a linear sliding-track 142. The linear sliding-track 142 is located at the tail end of the positioning sliding-track 141, and the linear sliding-track 142 and the positioning sliding-track 141 are communicated with each other.

As shown in FIGS. 1A and 1B, the second elastic member 15 is disposed on the outer surface S2 of the inner housing case 12 and connected to the swinging member 14. The second elastic member 15 is deformed to provide a second elastic force to the swinging member 14, wherein the second elastic force is used for returning the swinging member 14 back to the initial state. Specifically, examples of the second elastic member 15 include, but are not limited to a torsion spring disposed on the pivot portion 143, and a guiding needle disposed at one side of the swinging member 14. Firstly, the swinging member 14 is not swayed and is in the initial state. When the swinging member 14 is swayed along the second direction (Y-axis direction) and deviates from the initial state, the deformed second elastic member 15 provides the second elastic force to the swinging member 14 to return the swinging member 14 back to the initial state. In the preferred embodiment, the second elastic member 15 has a first end portion 151, a second end portion 152, and a main section 153 connected between the first end portion 151 and the second end portion 152. The second elastic member 15 and the swinging member 14 are disposed side by side along the second direction (Y-axis direction).

As described above, the first end portion 151 of the second elastic member 15 is connected with the a side portion of the swinging member 14. Specifically, the side portion of the swinging member 14 has an ear part 144 which has an aperture 145. When the swinging member 14 is in the initial state, the aperture 145 substantially extends parallel with the first direction (X-axis direction). The first end portion 151 of the second elastic member 15 has a folding arm 154 located in the aperture 145, such that the first end portion 151 of the second elastic member 15 is slidden along the aperture 145 and connected to the ear part 144. The side portion of the swinging member 14 is adjacent to the second slope 1412 of the positioning sliding-track 141. That is, the second slope 1412 of the positioning sliding-track 141 is more close to the second elastic member 15 compared to the first slope 1411 of the positioning sliding-track 141.

The second end portion 152 of the second elastic member 15 is fixed on the outer surface S2 of the inner housing case 12. Specifically, a stopper is protrudingly disposed on the outer surface S2 of the inner housing case 12 and adjacent to the side portion of the swinging member 14, and the stopper 125 is received in the accommodating space 122. In addition, the stopper 125 is located at a peripheral free space of the swinging member 14. Therefore, it does not occupy extra space. An example of the shape of the second end portion 152 of the second elastic member 15 is U-shape, and the second end portion 152 of the second elastic member 15 is sandwiched between the stopper 125 and the inner walls W1, W2 (shown FIG. 3A) of the accommodating space 122, such that the second end portion 152 of the second elastic member 15 is fixed on the outer surface S2 of the inner housing case 12.

The swinging member 14 further has a positioning part 146 so that the swinging member 14 may be swayed more steadily. The outer surface S2 of the inner housing case 12 corresponding to the swinging member 14 has an arcuate guiding groove 123. The positioning part 146 extends along a third direction (Z-axis direction) toward to the outer surface S2, and the positioning part 146 is located in the arcuate guiding groove 123. The positioning part 146 is slidden along the arcuate guiding groove 123 when the swinging member 14 is swayed, and the arcuate guiding groove 123 having a radial direction is identical with the swinging member 14 having a swaying radial direction.

As previously mentioned, when the first elastic member 13, the second elastic member 15, and the swinging member 14 are cooperatively worked, the inner housing case 12 may be slidden between the first and second positions, so that the USB connector 121 of the inner housing case 12 may be changed between hidden and protruded states. Please refer to FIGS. 3A to 3E. FIGS. 3A to 3E show actuations of the retractable USB connector 1 of FIG. 1A. The actuations of the retractable USB connector 1 of the preferred embodiment are combined with the Figures to be described in detail as follows.

Figure 3A:
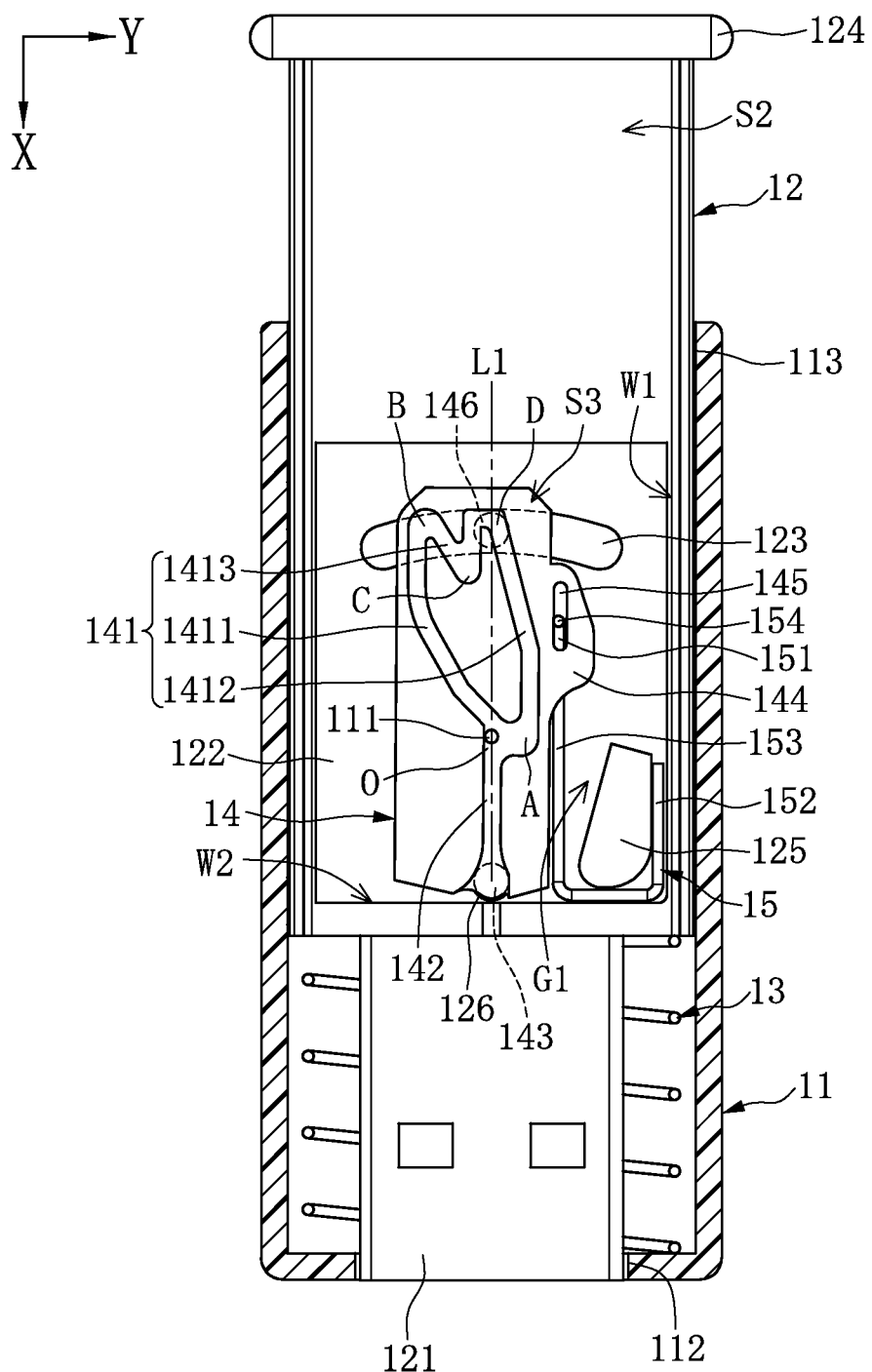
FIGS. 3A to 3E show actuations of the retractable USB connector of FIG. 1A.

As shown in FIG. 3A, firstly, the inner housing case 12 is located at the first position, and the USB connector 121 of the inner housing case 12 is hidden in the outer housing case 11. At this time, the swinging member 14 is not swayed and in the initial state. Moreover, an example of the guiding column 111 is located in an initial position of the positioning sliding-track 141 (Point O).

In particular, the positioning sliding-track 141 of the swinging member 14 is designed for the USB connector 121 of the retractable USB connector 1 having the abovementioned achievement by the first elastic member 13, the second elastic member 15, and the swinging member 14 cooperatively working together. Specifically, as shown in FIG. 3A, the first slope 1411 has a starting point (Point A) and a terminal point (Point B) opposite to the starting point, wherein the first slope 1411 is connected to the positioning sliding-track 1413 through the terminal point (Point B). The second slope 1412 has a starting point (Point D) and a terminal point (Point A) opposite to the starting point, wherein the second slope 1412 in connected to the positioning sliding-track 1413 through the starting point (Point D), and the terminal point (Point A) of the second slope 1412 is essentially the same as the starting point of the first slope 1411. The starting point (Point D) of the second slope 1412 and the pivot portion 143 located on a common reference line L1 parallel to the first direction (X-axis direction).

As previously said, when the swinging member 14 is in the initial state, the linear sliding-track 142 extends along a direction parallel to the first direction (X-axis direction). In such way, in the initial state, the guiding column 111 is located in the linear sliding-track 142. Thus, the linear sliding-track 142 may be used to increase the distance of the inner housing case 12 slidden in the first direction, and to stabilize the movement of the inner housing case 12. In the preferred embodiment, the linear sliding-track 142 is connected to the first slope 1411. When the swinging member 14 is in the initial state, the linear sliding-track 142 locates on a common reference line L1. Additionally, when the swinging member 14 is in the initial state, the main section 153 of the second elastic member 15 and the stopper 125 cooperatively has a gap G1 therebetween, such that the gap G1 may avoid the stopper 125 from hindering an actuation of the swinging member 14 or the second elastic member 15.

Figure 3B:
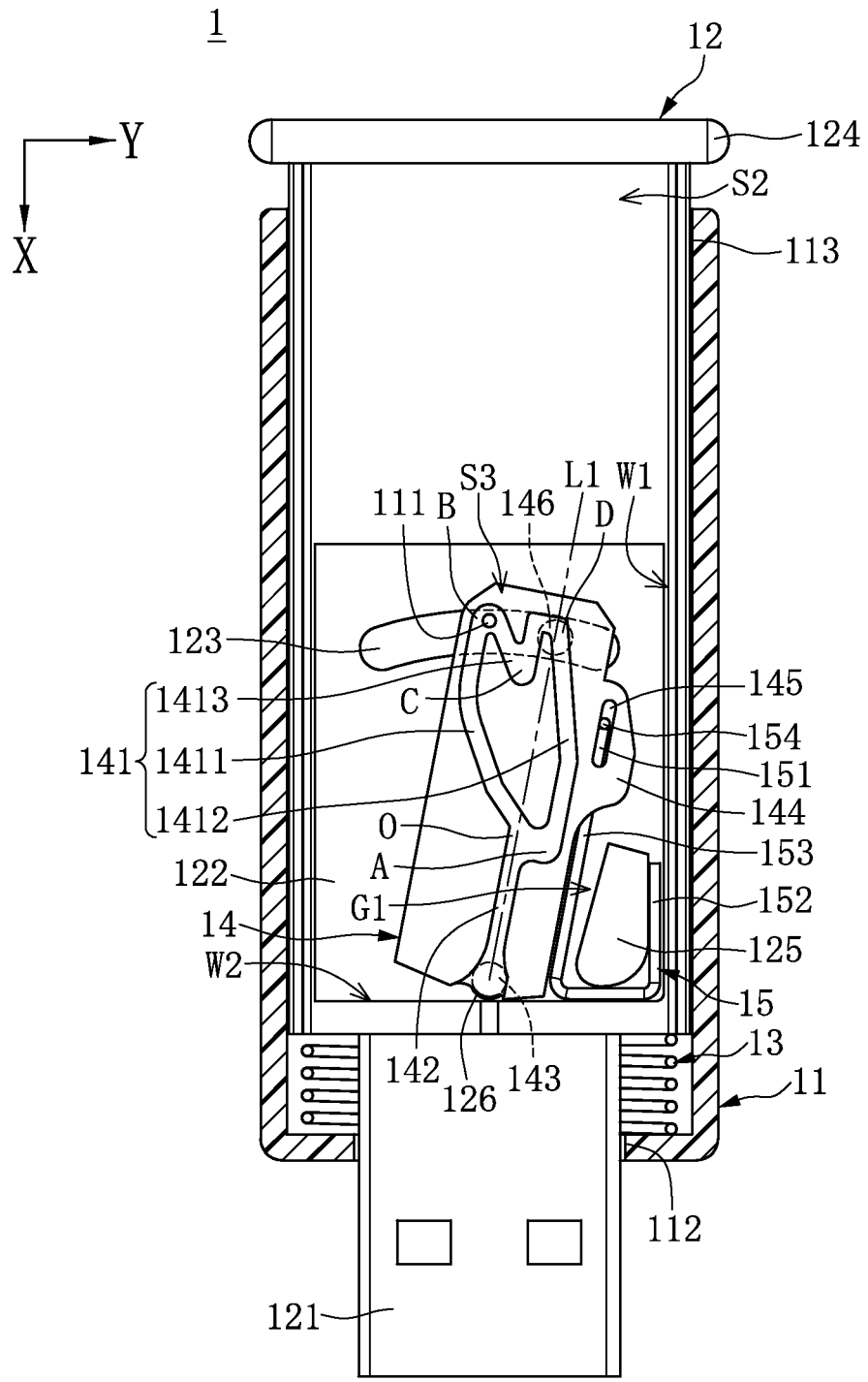

Referring to FIG. 3B, in a working state, the user may press the press portion 124 of the inner housing case 12 to push the inner housing case 12, and the USB connector 121 is protruded from the opening 112 of the outer housing case 11. In this process, the inner housing case 12 is slidden to let the first elastic member 13 be continuously deformed such as by compressive deformation, the deformed first elastic member 13 would continuously provide the first elastic force to the inner housing case 12 returning to the first position. Furthermore, when the swinging member 14 is slidden along with the pushed inner housing case 12 along the first direction, the inner margin of the first slope 1411 abuts against the guiding column 111 of the outer housing case 11 to push the swinging member 14 swaying along the second direction and away from the stopper 125, and the second elastic member 15 is constantly deformed to provide the second elastic force to the swinging member 14 for returning the swinging member 14 back to the initial state. In contrast, the guiding column 111 is moved into the first slope 1411 along the linear sliding-track 142, and then moved to the terminal point (Point B) of the first slope 1411 along the first slope 1411.

Figure 3C:
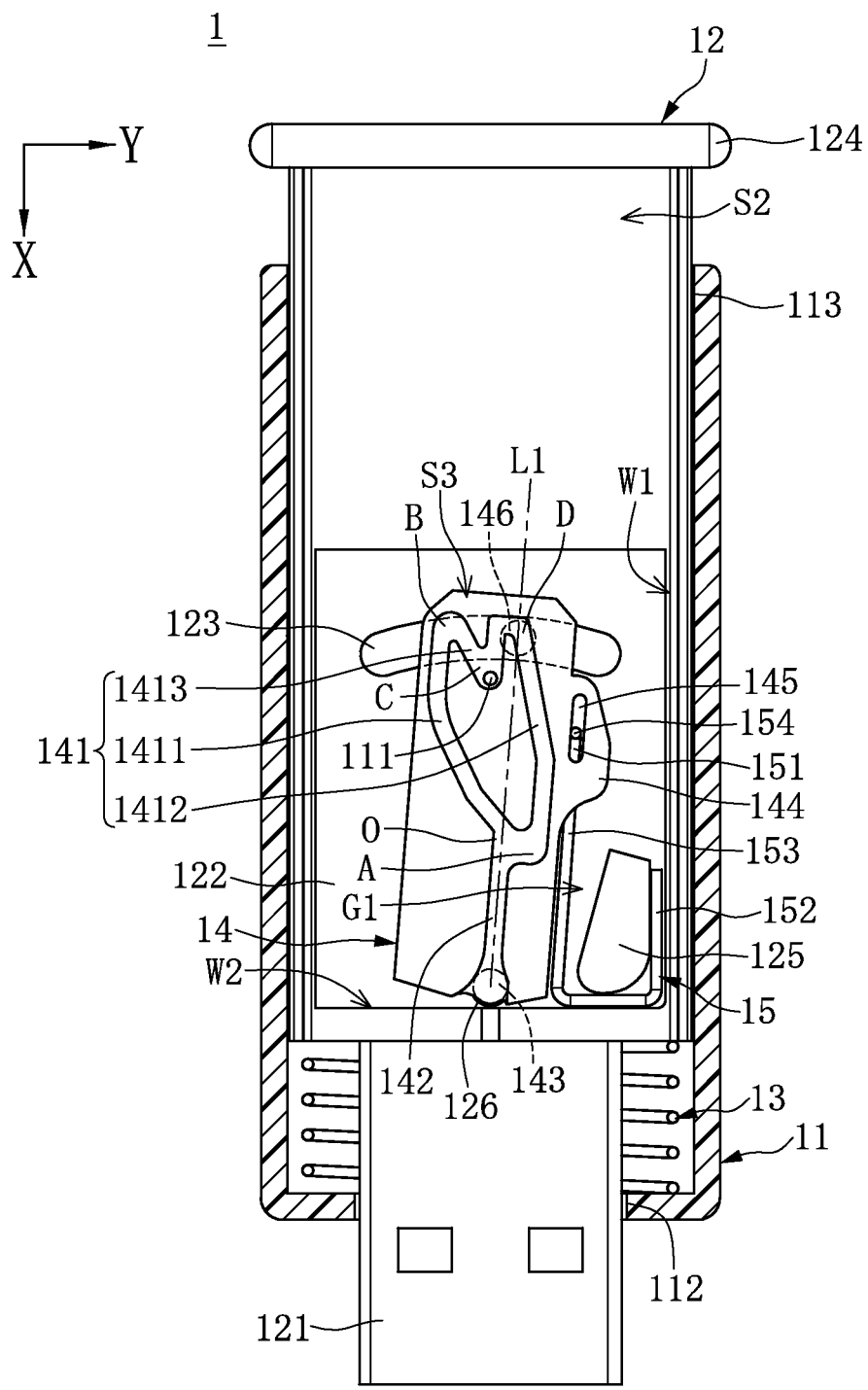

As shown in FIG. 3C, when the user stops pushing, under an action of the first elastic force, the inner housing case 12 is moved a predetermined distance along the first direction and away from the opening, and the swinging member 14 is also moved in pace with the inner housing case 12. Meanwhile, under an action of the second elastic force, the swinging member 14 is swayed along the second direction and toward the stopper 125. Contrastingly, the guiding column 111 is moved to the positioning point (Point C) along the concave positioning sliding-track 1413. At the same time, under the action of the first and second elastic forces, the relative displacement between the swinging member 14 with respect to the guiding column 111 is hindered by the concave positioning sliding-track 1413, so as to trigger the swinging member 14 to be positioned and stopped from swaying toward the stopper 125, and the swinging member 14 and the inner housing case 12 are stopped from moving along the first direction and away from the opening. When the swinging member 14 is positioned, a relative position of the inner housing case 12 with respect to the outer housing case 11 is not changed. That is to say, the inner housing case 12 stays at the second position without any change, and the USB connector 121 keeps in the protruded state without any change.

Figure 3D:
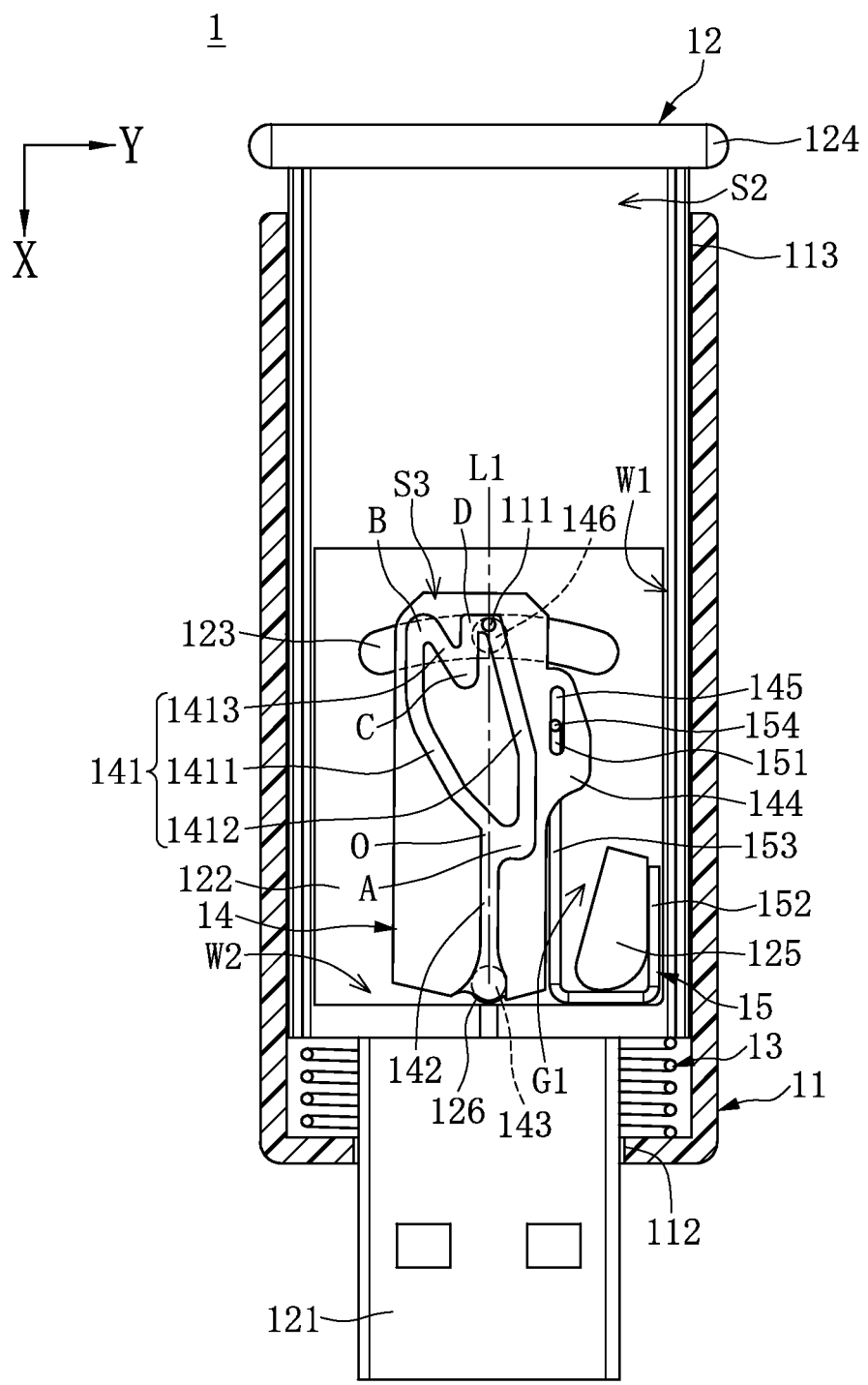

Refer to FIG. 3D, when the retractable USB connector 1 is not used, the user may press the press portion 124 of the inner housing case 12 again to push the inner housing case 12. The swinging member 14 is moved in pace with the pushed inner housing case 12 along the first direction and toward the opening 112, and the retracted positioning sliding-track 1413 of the swinging member 14 is away from the guiding column 111, such that the swinging member 14 is not positioned. Meanwhile, under the action of the second elastic force, the swinging member 14 is continuously swayed along the second direction and toward the stopper 125, and temporarily returned the initial state. In contrast, the guiding column 111 is moved from the positioning point (Point C) to the starting point (Point D) of the second slope 1412.

Figure 3E:
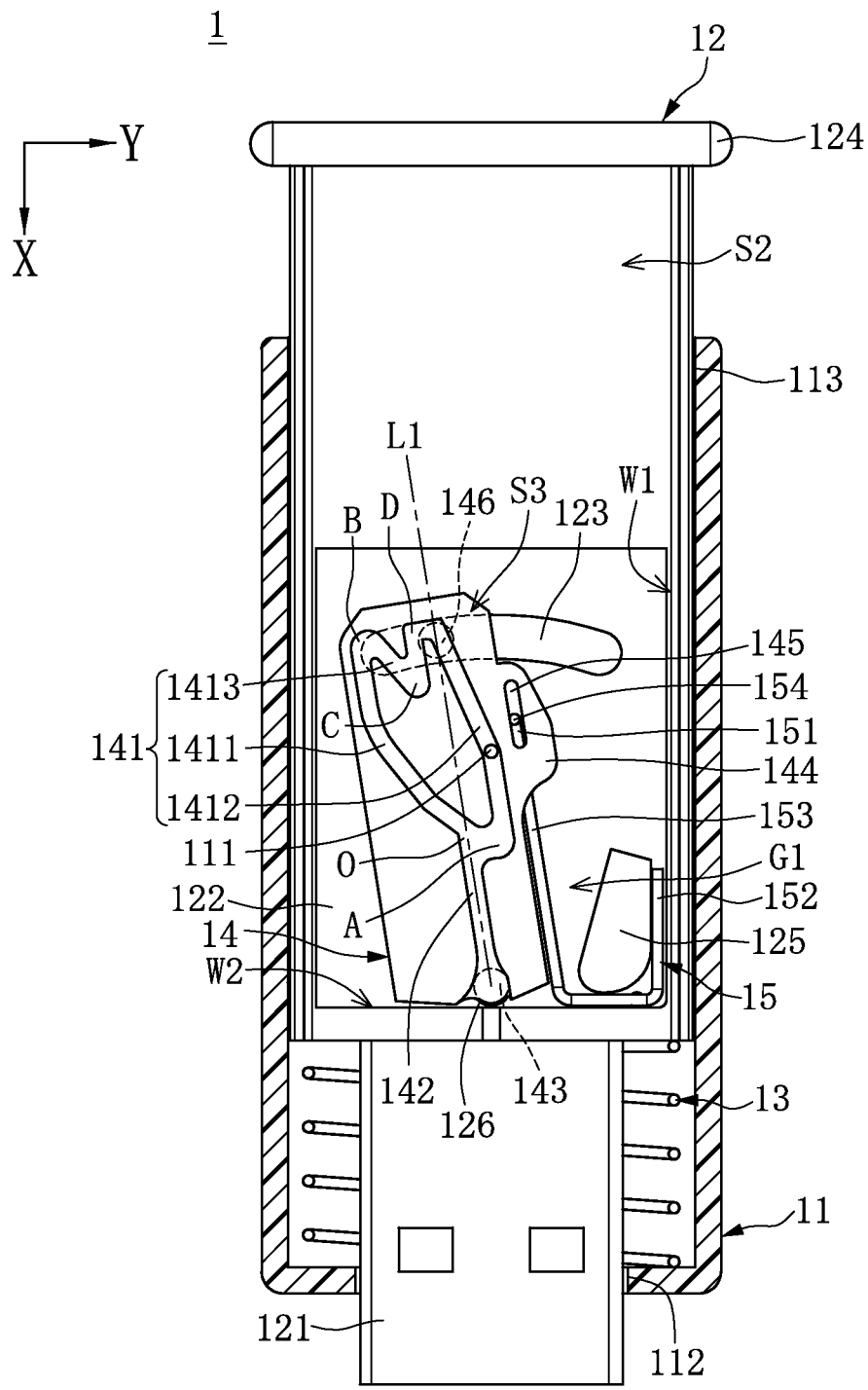
Figure 4:
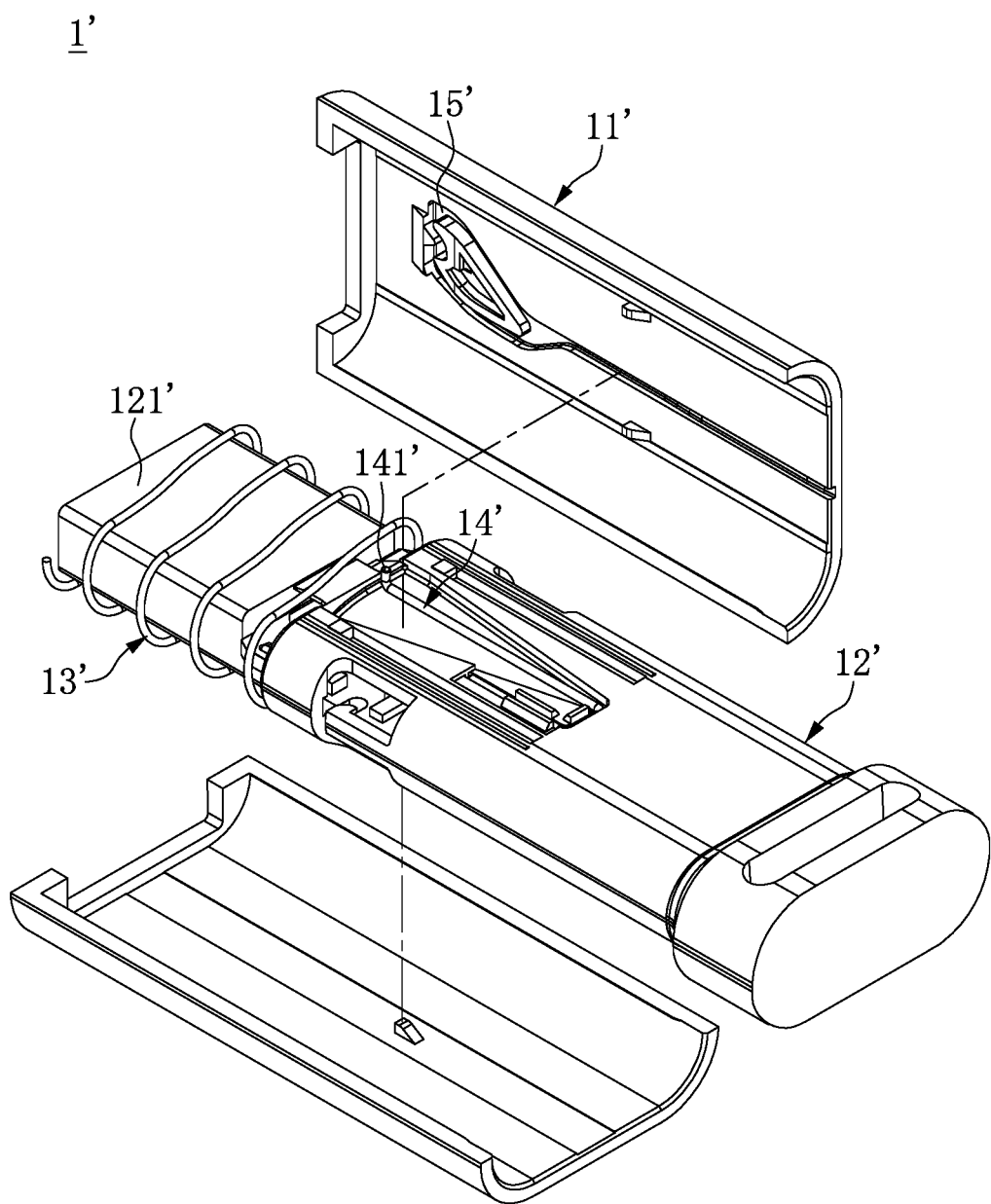
FIG. 4 shows a retractable USB connector in the market.

As shown in FIG. 3E, under the action of the first elastic force, the swinging member 14 is moved along with the inner housing case 12 along the first direction and away from the opening 112. In addition, when the swinging member 14 is moved along with the inner housing case 12 along the first direction, so as to abut against the guiding column 111 by the inner margin of the second slope 1412 to push the swinging member 14 swaying along the second direction and toward the stopper 125. In such a way, the second elastic member 15 is deformed to constantly provide the second elastic force to the swinging member 14 returning to the initial state. Contrastingly, the guiding column 111 is moved from the starting point (Point D) of the second slope 1412 to the terminal point (Point A) of the second slope 1412.

Please refer to FIG. 3A again, under the action of the first elastic force, the inner housing case 12 is returned to the first position of the initial state, and the USB connector 121 is in the hidden state again. The swinging member 14 is moved in pace with the inner housing case 12 along the first direction and away from the opening. Meanwhile, under the action of the second elastic force, the swinging member 14 is swayed along the second direction and away from the stopper 125 to return to the initial state. In contrast, the guiding column 111 is moved from the terminal point (Point A) of the second slope 1412 to the initial position (Point O).

In particular, when the inner housing case 12 is slidden between the first and second positions, the USB connector 121 of the inner housing case 12 is changed between the hidden and protruded states. When the swinging member 14, the first elastic member 13, and the second elastic member 15 are in the working state, the guiding column 111 of the outer housing case 11 remains stationary. Otherwise, the swinging member 14 pivoted on the inner housing case 12 is slidden in pace with the inner housing case 12 along the first direction to push the swinging member 14 to sway along the second direction, so that the relative position of the guiding column 111 in the positioning sliding-track 141 is changed, as above said. The movement about the guiding column 111 described previously is only for clearly explaining the actuation of the swinging member 14. Actually, the guiding column 111 and the outer housing case 11 are not relatively moved.

As shown in FIGS. 1A and 1B, a retractable USB connector 1 of the preferred embodiment of the present invention includes an outer housing case 11, an inner housing case 12, a first elastic member 13, a swinging member 14, and a second elastic member 15. The outer housing case 11 has an inner surface S1, and a guiding column 111 is protrudingly disposed on the inner surface S1. The inner housing case 12 is slidably disposed along a first direction in the outer housing case 11. A USB connector 121 is disposed on the inner housing case 12, and the outer housing case 11 has an opening 112 corresponded to the USB connector 121. The swinging member 14 is set on the inner housing case 12, a positioning sliding-track 141 is disposed on the swinging member 14, the guiding column 111 is located in the positioning sliding-track 141, and the positioning sliding-track 141 has a curved positioning track 1413. The first elastic member 13 extends along the first direction, and the second elastic member 15 is disposed on the inner housing case 12 and connected to the swinging member 14.

When the inner housing case 12 is slidden along the first direction and the USB connector 121 is protruded from the opening 112 of the outer housing case 11, the first elastic member 13 is deformed to provide a first elastic force to the inner housing case 12, an inner margin of the positioning sliding-track 141 abuts against the guiding column 111 to push the swinging member 14 swaying from an initial state and along a second direction, and the second elastic member 15 is deformed to provide a second elastic force to the swinging member 14, wherein the first elastic force is used for returning the inner housing case 12 back into the outer housing case 11, the second elastic force is used for returning the swinging member 14 back to the initial state.

In summary, the retractable USB connector 1 of the preferred embodiment of the present invention may use the swinging member 14 to cooperatively work with the first and second elastic members 13, 15, such that the USB connector 121 of the inner housing case 12 may be cyclically changed between hidden and protruded states. When the swinging member 14 is positioned, the USB connector 121 of the inner housing case 12 may stay in the protruded state without any change.

Additionally, the swinging member 14 and/or the second elastic member 15 may be one of the standardized components of the retractable USB connector 1 and be unifiedly manufactured so as to increase the utilization. In this way, different sizes and shapes of the retractable USB connector 1 may commonly use the swinging member 14 and/or the second elastic member 15 with standardized sizes to decrease the manufacturing cost.

Particularly, in the abovementioned embodiment, although the guiding column 111 is formed on the outer housing case 11, the swinging member 14 is pivoted on the inner housing case 12, but it is not limited herein. For example, in another embodiment, the guiding column 111 may be formed on the inner housing case 12, and the swinging member 14 is pivoted on the outer housing case 11. Specifically, the guiding column 111 may be formed on the outer surface S2 of the inner housing case 12, the swinging member 14 may be pivoted on the inner surface S1 of the outer housing case 11, and the positioning sliding-track 141 may be formed on a surface facing to the outer surface S2 of the swinging member 14. Furthermore, the second elastic member 15 may be disposed on the inner surface S1. The relative position, connection, and actuation of each component of the retractable USB connector 1 of the embodiment are similar to the previous preferred embodiment, so there is no further explanation here.

To sum up, the present invention provides a retractable USB connector which includes an outer housing case, an inner housing case, and a positioning assembly. The outer housing case has an opening. The inner housing case includes a USB connector disposed at a first end of the inner housing case, a press portion is disposed at a second end of the inner housing case, and the inner housing case is disposed in the outer housing case and relatively moved to the outer housing case. The positioning assembly is disposed between the outer housing case and the inner housing case, wherein the positioning assembly includes a swinging member and a guiding column. The swinging member has a positioning sliding-track, and one end of the guiding column is disposed in the positioning sliding-track. The guiding column is moved according to a relative position of the inner housing case with respect to the outer housing case. The swinging member is swayed via a movement of the guiding column in the positioning sliding-track so as to change the swinging member's position. When the guiding column is located at a positioning area of the positioning sliding-track, the positioning assembly fixes the relative position of the outer housing case with respect the inner housing case, and the USB connector is protruded from the opening of the outer housing case.

Depending on different products, for example, the guiding column can be formed at the outer housing case and the swinging member is pivoted at the inner housing case, or the guiding column is formed at the inner housing case and the swinging member is pivoted at the outer housing case. In addition, when the guiding column is located at the initial area of the positioning sliding-track (e.g., the linear sliding-track of the abovementioned embodiment), the USB connector is hidden in the outer housing case. Moreover, the inner housing case is moved along the first direction (X-axis direction of the previous embodiment) with respect to the outer housing case.

It is worth mentioning that the outer housing case, the inner housing case, and the positioning assembly of the embodiment of the present invention are not limited in the retractable USB connector. For example, the positioning assembly may be used in a disc ejecting mechanism of a computer or other consumer electronic devices.

The descriptions illustrated supra set forth simply the preferred embodiments of the present invention; however, the characteristics of the present invention are by no means restricted thereto. All changes, alterations, or modifications conveniently considered by those skilled in the art are deemed to be encompassed within the scope of the present invention delineated by the following claims.

What is claimed is:

1. A retractable USB (Universal Serial Bus) connector, comprising:
    an outer housing case having an opening;
    an inner housing case including a USB connector disposed at a first end of the inner housing case, a press portion disposed at a second end of the inner housing case, and the inner housing case is disposed in the outer housing case and is configured to move relative to the outer housing case; and
    a positioning assembly disposed between the outer housing case and the inner housing case;
    wherein, the positioning assembly includes a swinging member and a guiding column, the swinging member has a positioning sliding-track, one end of the guiding column is disposed in the positioning sliding-track, and the swinging member is swayed via a movement of the guiding column in the positioning sliding-track so as to change the position of the swinging member,
    wherein, when the guiding column is located at a positioning area of the positioning sliding-track, the positioning assembly fixes the relative position of the outer housing case with respect to the inner housing case, and the USB connector is protruded from the opening of the outer housing case, wherein the guiding column is formed on the outer housing case and the swinging member is pivotally disposed on the inner housing case.

2. The retractable USB connector as claimed in claim 1, wherein when the guiding column is located at an initial area of the positioning sliding-track, the USB connector is hidden in the outer housing case.

3. The retractable USB connector as claimed in claim 1, wherein the inner housing case is moved along a first direction with respect to the outer housing case.

4. The retractable USB connector as claimed in claim 1, further comprising a first elastic member, wherein when the USB connector is protruded from the opening of the outer housing case, the first elastic member is deformed to provide a first elastic force to the inner housing case.

5. The retractable USB connector as claimed in claim 4, further comprising a second elastic member connected to the swinging member, wherein when the swinging member is swayed, the second elastic member is deformed to provide a second elastic force to the swinging member.

6. A retractable USB connector, comprising:
an outer housing case having an inner surface, and a guiding column protrudingly disposed on the inner surface;
an inner housing case disposed in the outer housing case, the inner housing case is slidable along a first direction, a USB connector is disposed on the inner housing case, and the outer housing case has an opening corresponded to the USB connector;
a first elastic member located between the outer housing case and the inner housing case and extending along the first direction;
a swinging member pivotally disposed on the inner housing case, a positioning sliding-track is disposed on the swinging member, the guiding column is located in the positioning sliding-track, and the positioning sliding-track has a curved positioning track; and
a second elastic member disposed on the inner housing case and connected to the swinging member;
wherein, when the inner housing case is slidden along the first direction and the USB connector is protruded from the opening of the outer housing case, the first elastic member is deformed to provide a first elastic force to the inner housing case, an inner margin of the positioning sliding-track abuts against the guiding column to push the swinging member to sway along a second direction from an initial state, and the second elastic member is deformed to provide a second elastic force to the swinging member, wherein the first elastic force is used for returning the inner housing case back into the outer housing case, the second elastic force is used for returning the swinging member back to the initial state.

7. The retractable USB connector as claimed in claim 6, wherein the inner housing case has an outer surface facing the inner surface, the swinging member and the second elastic member are both disposed on the outer surface, the positioning sliding-track is disposed on a surface of the inner housing case facing the inner surface.

8. The retractable USB connector as claimed in claim 7, wherein when the inner housing case is located at a first position, the USB connector is hidden in the outer housing case, when the inner housing case is slidden to a second position, the USB connector is protruded from the opening of the outer housing case, and when the inner housing case is located at the first position, the swinging member is in the initial state.

9. The retractable USB connector as claimed in claim 8, wherein when the inner housing case is located at the second position, the guiding column is positioned at the positioning sliding-track.

10. The retractable USB connector as claimed in claim 7, wherein the positioning sliding-track further comprising a first slope and a second slope, the first slope faces the USB connector, the second slope faces away from the USB connector, and a curved positioning sliding-track is connected between the first and second slopes.

11. The retractable USB connector as claimed in claim 8, wherein the swinging member has a pivot portion, the swinging member is pivoted on the outer surface of the inner housing case through the pivot portion.

12. The retractable USB connector as claimed in claim 7, wherein the second elastic member and the swinging member are disposed side by side along the second direction, a first end portion of the second elastic member is connected to a side portion of the swinging member, and a second end portion of the second elastic member is fixed on the outer surface.

13. The retractable USB connector as claimed in claim 12, wherein the side portion of the swinging member has an ear part, the first end portion of the second elastic member is connected to the ear part of the first end portion.

14. The retractable USB connector as claimed in claim 13, wherein the ear part has an aperture extending in a direction parallel to the first direction, and the first end portion of the second elastic member has a folding arm located in the aperture, such that the first end portion of the second elastic member is slidably connected to the ear part along the aperture.

15. The retractable USB connector as claimed in claim 14, wherein the outer surface of the inner housing case further has an accommodating space, and the swinging member and the second elastic member are both received in the accommodating space.

16. The retractable USB connector as claimed in claim 15, wherein a stopper is protrudingly disposed on the outer surface of the inner housing case and adjacent to the side portion of the swinging member, the stopper is received in the accommodating space, and the second end portion of the second elastic member is sandwiched between the stopper and an inner wall of the accommodating space, such that the second end portion of the second elastic member is fixed on the outer surface of the inner housing case.

17. The retractable USB connector as claimed in claim 7, wherein the swinging member has a positioning part extending toward the outer surface of the inner housing case, the outer surface of the inner housing case corresponding to the swinging member has an arcuate guiding groove, the positioning part is located in the an arcuate guiding groove, when the swinging member is swayed, the positioning part is slidden along the arcuate guiding groove and a radial direction of the arcuate guiding groove is identical with a swaying radial direction of the swinging member.

18. The retractable USB connector as claimed in claim 6, wherein the first elastic member is a spring located in the outer housing case and surrounds the USB connector, and the second elastic member is a torsion spring or a guiding needle.

\* \* \* \* \*